(12) United States Patent
Hahn et al.

(10) Patent No.: US 8,166,084 B2
(45) Date of Patent: Apr. 24, 2012

(54) CALIBRATION OF ADJUSTABLE FILTERS

(75) Inventors: Wilhelm Steffen Hahn, Los Altos, CA (US); Wei Chen, Newark, CA (US)

(73) Assignee: Intersil Americas Inc., Milpitas, CA (US)

( * ) Notice: Subject to any disclaimer, the term of this patent is extended or adjusted under 35 U.S.C. 154(b) by 187 days.

(21) Appl. No.: 12/652,281

(22) Filed: Jan. 5, 2010

(65) Prior Publication Data

US 2010/0244945 A1   Sep. 30, 2010

Related U.S. Application Data

(63) Continuation-in-part of application No. 12/413,454, filed on Mar. 27, 2009.

(51) Int. Cl.
*G06J 1/00* (2006.01)
*G06F 17/10* (2006.01)

(52) U.S. Cl. ............................................. 708/3; 708/322

(58) Field of Classification Search .......... 708/300–322, 708/819
See application file for complete search history.

(56) References Cited

U.S. PATENT DOCUMENTS

| | | | |
|---|---|---|---|
| 4,349,889 A * | 9/1982 | van den Elzen et al. | 708/322 |
| 4,843,583 A * | 6/1989 | White et al. | 708/322 |
| 5,425,060 A * | 6/1995 | Roberts et al. | 708/313 |
| 5,687,104 A * | 11/1997 | Lane et al. | 708/300 |
| 5,991,339 A * | 11/1999 | Bazes et al. | 708/323 |
| 6,003,051 A * | 12/1999 | Okazaki | 708/300 |
| 6,091,366 A | 7/2000 | Zhang et al. | |
| 6,256,342 B1 * | 7/2001 | Schlag et al. | 708/323 |
| 6,385,435 B1 | 5/2002 | Lee | |
| 7,035,361 B2 | 4/2006 | Kim et al. | |
| 7,050,388 B2 | 5/2006 | Kim et al. | |
| 7,123,676 B2 | 10/2006 | Gebara et al. | |
| 7,173,551 B2 | 2/2007 | Vrazel et al. | |
| 7,215,721 B2 | 5/2007 | Hietala et al. | |
| 7,366,244 B2 | 4/2008 | Gebara et al. | |
| 2004/0213354 A1 | 10/2004 | Jones et al. | |
| 2007/0060059 A1 | 3/2007 | Kim et al. | |
| 2007/0064923 A1 | 3/2007 | Schmukler et al. | |
| 2009/0016545 A1 | 1/2009 | Stelliga et al. | |

* cited by examiner

*Primary Examiner* — Tan Mai
(74) *Attorney, Agent, or Firm* — King & Spalding

(57) ABSTRACT

A filter controller. In one embodiment, the filter controller includes a first mechanism for providing an input signal to an adjustable filter. A second mechanism measures a response of the adjustable filter to the input signal and provides a second signal in response thereto. A third mechanism sets one or more parameters of the adjustable filter in response to the second signal. In a more specific embodiment, the adjustable filter includes one or more sub-filters, such as a canceller filter, which may be any filter that employs one or more portions or versions of a signal to selectively cancel one or more portions or versions, such as frequency components, of the same signal.

35 Claims, 10 Drawing Sheets

CALIBRATION OF ADJUSTABLE FILTERS

CROSS REFERENCE TO RELATED APPLICATIONS

This application is a continuation-in-part of and claims priority to co-pending U.S. patent application Ser. No. 12/413,454, filed on Mar. 27, 2009 and entitled "FILTER SHAPING USING A SIGNAL-CANCELLATION FUNCTION," which is hereby incorporated by reference as if set forth in this application in full for all purposes.

BACKGROUND

This disclosure relates generally to signal filters and more specifically relates to systems and methods for calibrating or configuring filter parameters and behaviors.

Electronic filters are employed in various demanding applications, including cellular telephone transceiver circuits, Global Positioning System Receivers, Wireless Local Network (WLAN) transceivers, Blue Tooth transceivers, sound processing circuits, electronic noise cancellation circuits, and so on. Such applications demand versatile cost-effective filters capable of attenuating or amplifying certain frequency components of a given input signal.

Versatile filters and accompanying systems and methods for calibrating them are particularly useful for reducing electronic noise in wireless mobile and computing applications. A given wireless application, such as a multi-featured cellular telephone application, may include various antennas and sub-systems incorporated into a single device. Signals generated or received by one sub-system may interfere with signals generated or received by a second system. The variability of the systems (WLAN, WiMax, WCDMA, GPS, Bluetooth) and environments in which the sub-systems operate demand flexibility in controlling and/or calibrating accompanying signal filters.

Unfortunately, existing filters for reducing noise and interference in electronic circuits often lack flexibility to adapt to different signal environments or user scenarios. Accordingly, multiple different types of pre-calibrated filters are often used. Unfortunately, this is often costly, space inefficient, and may undesirably increase power consumption. Generally, a lack of adjustable filters and accompanying methods for effectively calibrating them exists.

DETAILED DESCRIPTION OF EXAMPLE EMBODIMENTS

Figure 1:
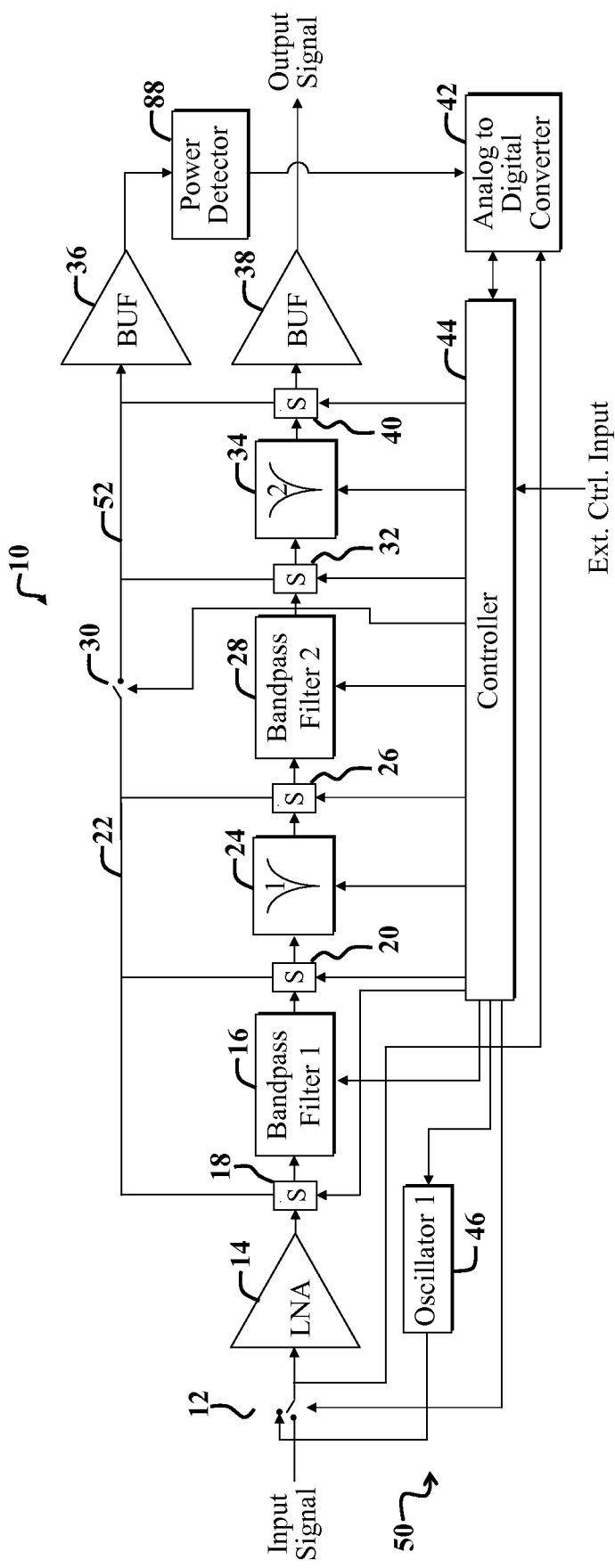
FIG. 1 illustrates a first example controllable filter and accompanying controller.

An example embodiment implements a calibration system for calibrating a circuit, such as a filter to account for the impact of temperature, voltage, and process variation while still maintaining the basic circuit function. Those skilled in the art will appreciate that concepts applicable to various embodiments disclosed herein are not limited to a specific filter class or function, and certain calibration functions need not be incorporated into a filter. For example, certain calibration methods may be applicable regardless of the functionality of the circuit/filter being calibrated. For example, certain calibration methods disclosed herein may be performed during testing of a filter or other device, circuit, system, or product and/or may be performed immediately before, during, or after operation of the filter, device, circuit, system, or product.

An example filter controller includes a first mechanism for providing an input signal (e.g. calibration tone) to an adjustable filter. A second mechanism measures a response of the adjustable filter to the input signal and provides a second signal in response thereto. A third mechanism sets one or more parameters of the adjustable filter in response to the second signal.

In a more specific embodiment, the adjustable filter includes one or more sub-filters, such as a canceller filter. For the purposes of the present discussion, a canceller filter may be any filter that employs one or more portions or versions of a signal to selectively cancel one or more portions or versions, such as frequency components, of the same signal.

In the specific embodiment, the canceller filter includes a Quality factor Enhancer (QE) resonator. The controller further includes instructions for adjusting one or more values of one or more circuit elements of the QE resonator. The instructions further include commands for setting an input signal to the QE resonator so that an output of the QE resonator exhibits an oscillation; then comparing the oscillation frequency to a reference frequency and providing a difference signal in response thereto; and then adjusting the one or more circuit values of the one or more circuit elements of the QE resonator to minimize the difference signal.

The canceller filter further includes a phase shifter. The controller further includes instructions for adjusting a center frequency of a frequency response of one or more canceller filters by inputting a pilot signal at a first frequency to the phase shifter and then adjusting one or more parameters of the canceller filter so that a power level of an output signal of the canceller filter is reduced or minimized at the first frequency. The first frequency corresponds to a desired notch frequency of one or more canceller filters. For multiple notches at different frequencies, corresponding pilot signal frequencies are employed.

For the purposes of the present discussion, a signal is said to be at a particular frequency or characterized by a particular frequency if the signal exhibits an oscillation occurring at the frequency or within a particular frequency range of the frequency. In practice the frequency of a signal oscillation may vary. In this case, the center frequency or median frequency of the varying frequencies or oscillations is said to be the frequency of the signal.

In an illustrative embodiment, the controller includes instructions for determining the one or more parameters of the adjustable filter based on a circuit environment of the controllable filter. In an example embodiment, the instructions include a mechanism for establishing one or more values of the one or more parameters based on a temperature measurement of the accompanying signal environment. The instructions further include a mechanism for adjusting one or more of the parameters at predetermined time intervals (or triggered by a temperature change itself, a voltage or process variation) or based on another signal or function, such as an RSSI, power level, bit error rate, user interaction (e.g. channel change) or similar signal indicative of a change in the signal environment.

The instructions may further include a mechanism for setting one or more parameters of one or more notch sub-filters of the adjustable filter to suppress output power of the notch sub-filters at one or more desired frequencies. The instructions may further include setting one or more parameters of one or more bandpass sub-filters of the adjustable filter to increase or maximize output power of the one or more bandpass sub-filters at one or more desired frequencies. The controller may include a fourth mechanism for selectively calibrating each bandpass sub-filter of the adjustable filter as a notch filter and for selectively calibrating each notch filter of the adjustable filter as a bandpass filter.

The novel design of certain embodiments discussed herein is facilitated by the ability of the controller to adjust the behavior of a filter in response to changing signal environments or otherwise to meet the needs of a given application. Conventionally, signal filters lack substantial adjustability or controllability. Consequently, filters must often be redesigned for different applications at significant expense, and changing signal environments may render the redesigned filters periodically ineffective. Certain embodiments discussed herein address these problems.

For clarity, various well-known components, such as signal splitters, digital-to-analog converters, power supplies, and so on, have been omitted from the figures. However, those skilled in the art with access to the present teachings will know which components to implement and how to implement them to meet the needs of a given application.

FIG. 1 illustrates a first example controllable filter 10 and accompanying control system 50. The filter 10 includes a first input switch 12, which is adapted to selectively switch an input of the filter 10 or a reference signal input from a controllable reference oscillator 46 to an input of a Low Noise Amplifier (LNA) 14.

An output of the LNA 14 is coupled to an input of a first bandpass filter 16 via a second switch 18. The output of the LNA 14 is also selectively coupled to a first node 22 via the second switch 18. An output of the first bandpass filter 16 is selectively coupled to an input of a first notch filter 24 via a third switch 20. The third switch 20 also selectively couples the output of the first bandpass filter 16 to the first node 22. An output of the first notch filter 24 is coupled to an input of a second bandpass filter 28 via a fourth switch 26. The fourth switch 26 also selectively couples the output of the first notch filter 24 to the first node 22.

An output of the second bandpass filter 28 is selectively coupled to an input of a second notch filter 34 via a fifth switch 32. The fifth switch 32, which is optional and is used for improving component isolation, also selectively couples an output of the second bandpass filter 28 to a second node 52.

An output of the second notch filter 34 is coupled to an input of an output buffer 38 via a sixth switch 40. The output of the aforementioned buffer 38 represents the output of the filter 10. The sixth switch 40 also selectively couples the output of the second notch filter 34 to the second node 52. The second node 52 and the first node 22 are selectively coupled via a seventh switch 30. To provide a very flexible calibration scheme, a second buffer 36 is coupled between the second node 52 and the input of a power detector 88, which then feeds into the Analog to Digital Converter 42.

In the present specific embodiment, each of the filter components 12-52 is coupled to a controller 44 and may be controlled thereby. The various switches 12, 18, 20, 26, 30, 32, 40 are used to selectively switch out different circuit components 14, 16, 24, 28, 34, 36, 38 for individual component calibration. However, those skilled in the art with access to the present teachings will appreciate that the various switches 12, 18, 20, 26, 30, 32, 40 and/or one or more of the buffers 36, 38 may be omitted from certain embodiments without departing from the scope of the present teachings. Similarly additional switches might be implemented to improve isolation/performance. Furthermore, the adjustable filter 10 may include more or fewer sub-filters 16, 24, 28, 34, without departing from the scope of the present teachings.

In the present specific embodiment, the controller 44 is a digital controller or a hybrid digital and analog controller, and the filter 10 is analog filter. Accordingly, control outputs from the controller 44 are first converted from digital to analog signals, such as via a digital-to-analog converter (not shown), as needed before being applied to control or adjust the various filter components 14, 16, 24, 28, 34, 36, 38. Note that the controller 44 and filter 10 may be implemented via all analog components, a hybrid of analog and digital components, or all digital components depending on the needs of a given application.

An power detector 88 followed by an Analog-to-Digital Converter (ADC) 42, which may be switched to every node in the signal path as discussed more fully below, receives, e.g., input from the output of the first buffer 38, which is representative of the output of the filter 10. The PADC 88/42 may also receive input from the output of the first notch filter 24 or the second notch filter 34 as well as the first band pass filter 16 or the second band pass filter 28. The PADC 88/42 provides output to the controller 44 and may receive control signals from the controller 44. The control signals received by the PADC 88/42 from the controller 44 may be used to control internal parameters, including the frequencies of one or more internal oscillators or the mixing behavior of one or more internal mixers or other components. Note that the ADC 42 may be implemented within the controller 44, as discussed with reference to FIGS. 5 and 6 below.

The controller 44 also receives input from the output of the first switch 12, wherein the input is representative of the input signal to the LNA 14. However, this input is first routed to the ADC 42 for conversion to a digital signal.

A controllable reference oscillator, Voltage Controlled Oscillator (VCO) 46, receives control input from the controller 44 and may be used to input a pilot tone or test signal to the filter 10. For the purposes of the present discussion, a pilot tone, which is also called a pilot signal herein, may be any signal used to calibrate or test a circuit. An example pilot signal is an input test signal with predetermined spectral characteristics.

In operation, the controller 44 is used to shape the filter 10 as desired. For the purposes of the present discussion, a filter is said to be shaped when its transfer function or frequency response characteristics are modified or adjusted.

The behavior of a filter is typically depicted via a frequency response curve, which is often a graphical depiction of the transfer function of a circuit or filter. A transfer function may be any mathematical depiction of circuit behavior as it pertains to a given input signal or range of input signals. Frequency response curves often depict the effects of a filter on the amplitude of an input signal versus the frequency of the signal.

In the present specific embodiment, the control system 50, which includes the controller 44, reference oscillator 46, and PADC 88/42, implements various calibration modes. In an initial calibration mode, circuit sub-filters, including the first bandpass filter 16, the first notch filter 24, the second bandpass filter 28, and the second notch filter 34, are individually taken out of the filter 10 by the controller 44 by adjusting the switches 18, 20, 26, 30, 32, 40. Each sub-filter 16, 24, 28, 34 is then individually calibrated by applying a predetermined frequency or range of frequencies, via the reference oscillator 46, to each sub-filter 16, 24, 28, 34 and then measuring filter output. One or more routines running on the controller 44 then adjust individual controllable parameters of the sub-filters 16, 24, 28, 34 to achieve a desired frequency response for each sub-filter 16, 24, 28, 34.

In one implementation, only one sub-filter of elements 16, 24, 28 and 34 is taken out of the filter 10, and the remaining filter output lacks this filter function. This might be compensated by a redundant notch filter, which may either be used as a bandpass or as notch filter.

Each of the sub-filters 16, 24, 28, 34 includes a Quality Factor Enhancer (QE) resonator in an accompanying Q-enhancer module, which may function like a delay module, as discussed more fully below. The notch sub-filters 24, 34 may also include phase shifters that affect the position of the notch of the frequency responses. First the QE resonators of the sub-filters 24, 34 are calibrated by powering the QE resonators so that they resonate, thereby providing corresponding oscillating output signals. This may be detected with the power detector 88 and the ADC 42, and, in the present embodiment, the current to the QE resonators is varied such that the oscillation in the output signals stops. In the present specific embodiment, each notch sub-filter is then configured as a bandpass filter, and the output of the oscillator 46 is applied to the bandpass filter input. Parameters, such as values of variable capacitors in the QE resonators are then adjusted so that the resonating frequencies of the individual QE resonators match a desired frequency characteristic. For example, the resonating frequencies may be maximized, and this may be achieved via one or more algorithms running on the controller 44 after switching the output of the corresponding filter being calibrated to the PADC 88/42, which then provides corresponding input to the controller 44.

In the present example embodiment, the phase shifters of the notch sub-filters 24, 34 are calibrated by inputting a pilot tone, such as via the oscillator 46, to each notch sub-filter 24, 34, and then adjusting the gain settings of Variable Gain Amplifiers (VGAs) within each phase shifter thereof, such that the output power of the notch sub-filters 24, 34 is at a minimum at a desired input frequency (for notch filter calibration).

In a second operational mode, the controller 44 receives input indicative of a circuit environment of the filter 10 and makes any desired adjustments to parameters of the sub-filters 16, 24, 28, 34 in response thereto. For the purposes of the present discussion, a circuit environment of a filter or circuit component may include feedback pertaining to interference signals from adjacent transceivers, clocks, or other circuits, and may generally include any parameters or characteristics of the region surrounding the filter or circuit component, including, but not limited to, circuit temperature, supply voltage, radio band or channel change, aging, thermal radiation exposure, and so on. The terms "circuit environment" and "signal environment" are employed interchangeably herein.

For example, the controller 44 may receive external inputs, such as an input indicating the temperature of the signal environment of the filter 10, and may then automatically trigger re-calibration of the sub-filters 16, 24, 28, 34, using one or more parameters specified in a Look-Up Table (LUT) for the given measured temperature or temperature range. Alternatively, or in addition, re-calibration of the sub-filters 16, 24, 28, 34 may occur automatically at predetermined times.

Figure 2:
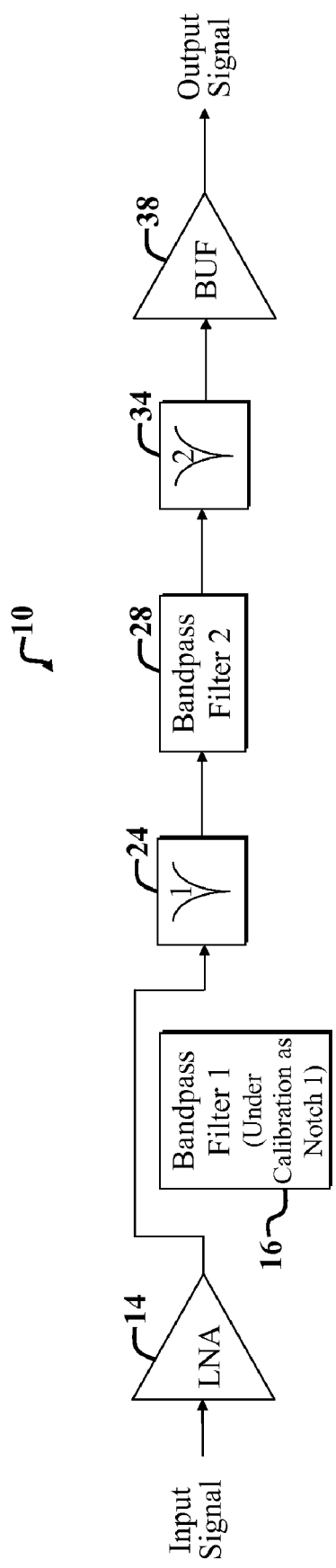
FIG. 2 illustrates the controllable filter of FIG. 1 in a first calibration configuration.
Figure 3:
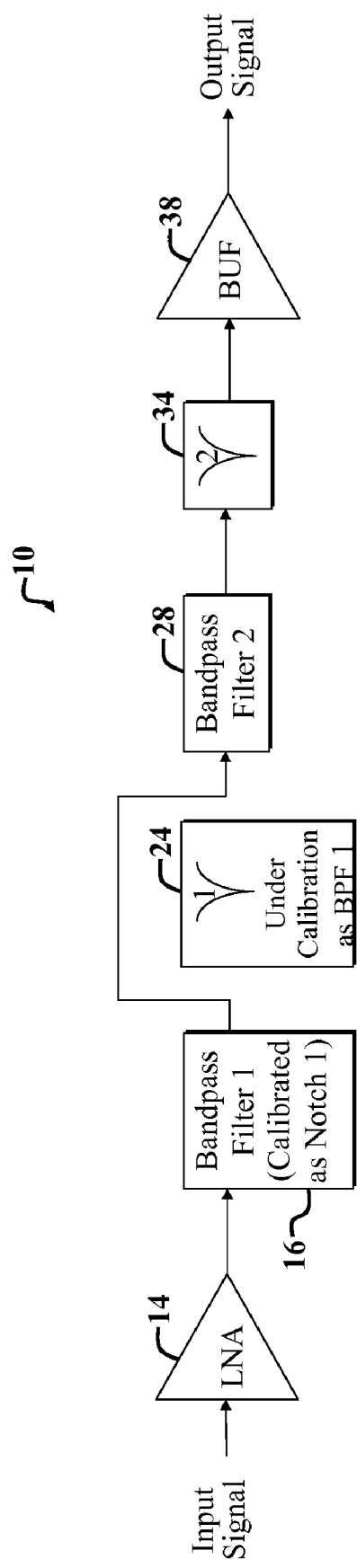
FIG. 3 illustrates the controllable filter of FIG. 1 in a second calibration configuration.

The following discussion with reference to FIGS. 2 and 3 illustrate how different components of the filter 10 may be separately calibrated, whereby each component is selectively switched out of the filter 10, then calibrated, while the remainder of the filter 10 is disabled.

FIG. 2 illustrates the controllable filter 10 of FIG. 1 in a first calibration configuration. For clarity, the various switches 12, 18, 20, 26, 30, 32, 40, and the control system 50 are not shown in FIG. 2. In FIG. 2, the controllable filter 10 is shown configured for calibrating the first bandpass sub-filter 16. In this configuration, the first bandpass filter 16 is taken out of the filter 10 and calibrated as a notch filter. In this case, parameters of the bandpass sub-filter 16 are set so that the maximum of the frequency response of the first bandpass filter 16 occurs at the predetermined input frequency to the first bandpass sub-filter 16.

Switching the type of the filter sub-filter (e.g., calibrating a bandpass filter as a notch) during calibration may ensure better performance of the remaining filter. However, the first bandpass sub-filter 16 may also be calibrated as a bandpass filter, and the sub-filter 24 may be calibrated as a notch (as discussed below) without departing from the scope of the present teachings.

FIG. 3 illustrates the controllable filter 10 of FIG. 1 in a second calibration step. For clarity, the various switches 12, 18, 20, 26, 30, 32, 40, and the control system 50 are not shown in FIG. 3. In FIG. 3, the controllable filter 10 is shown configured for calibrating the first notch sub-filter 24. In this configuration, the first notch sub-filter 24 is taken out of the filter and calibrated as bandpass filter. In this case, parameters of the notch sub-filter 24 are set so that the maximum of the frequency response of the first notch sub-filter 24 occurs at the predetermined input frequency to the first notch sub-filter 24. Switching the type of the filter sub-filter during calibration in accordance with the foregoing may ensure better performance of the remaining filter. However, the first notch sub-filter 24 may also calibrated as a notch filter without departing from the scope of the present teachings.

Similarly, in accordance with the present embodiment, the second bandpass sub-filter 28 is taken out of the filter 10 and calibrated, e.g., as a notch filter, and the second notch sub-filter 34 is taken out of the filter 10 and calibrated as a bandpass filter. Again, the sub-filter 24 may also be calibrated as a notch filter instead of as a bandpass filter without departing from the scope of the present teachings.

Figure 4:
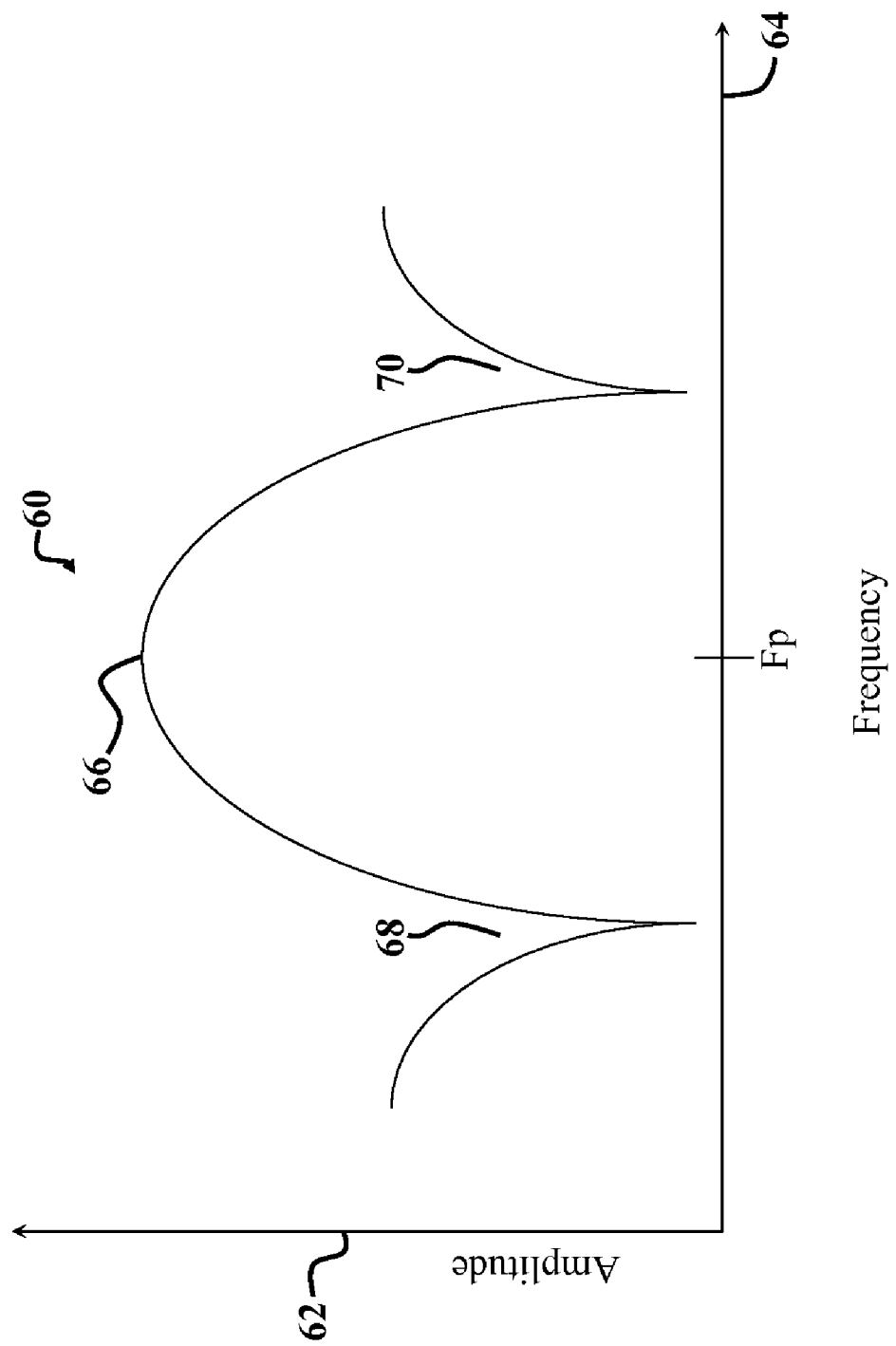
FIG. 4 is a graph of an example frequency response of the filter of FIG. 1.

FIG. 4 is a graph of an example frequency response 60 of the controllable filter 10 of FIG. 1. The frequency response 60 is plotted as a function of output signal amplitude 62 versus frequency 64. The frequency response 60 includes a peak response 66 at a desired passband center frequency ($F_{BPF}$), with a first notch 68 centered left of the peak response 66 and a second notch 70 centered right of the peak response 66.

With reference to FIGS. 1 and 4, the first notch 68 may result from the first notch sub-filter 24 of FIG. 1, and the second notch 70 may result from the second notch sub-filter 34 of FIG. 1. The peak response 66 may result in part from the individual frequency responses of the bandpass filters 16 and 28 of FIG. 1. The positions of the notches 68, 70 may be adjusted by the controller 44 of FIG. 1, such as by adjusting the gains in the VGAs included in the notch sub-filters 24, 34 of FIG. 1. Similarly, the position of the peak response 66 may be adjusted by the controller 44, such as by adjusting variable capacitors in the bandpass sub-filters 16, 28 of FIG. 1.

Figure 5:
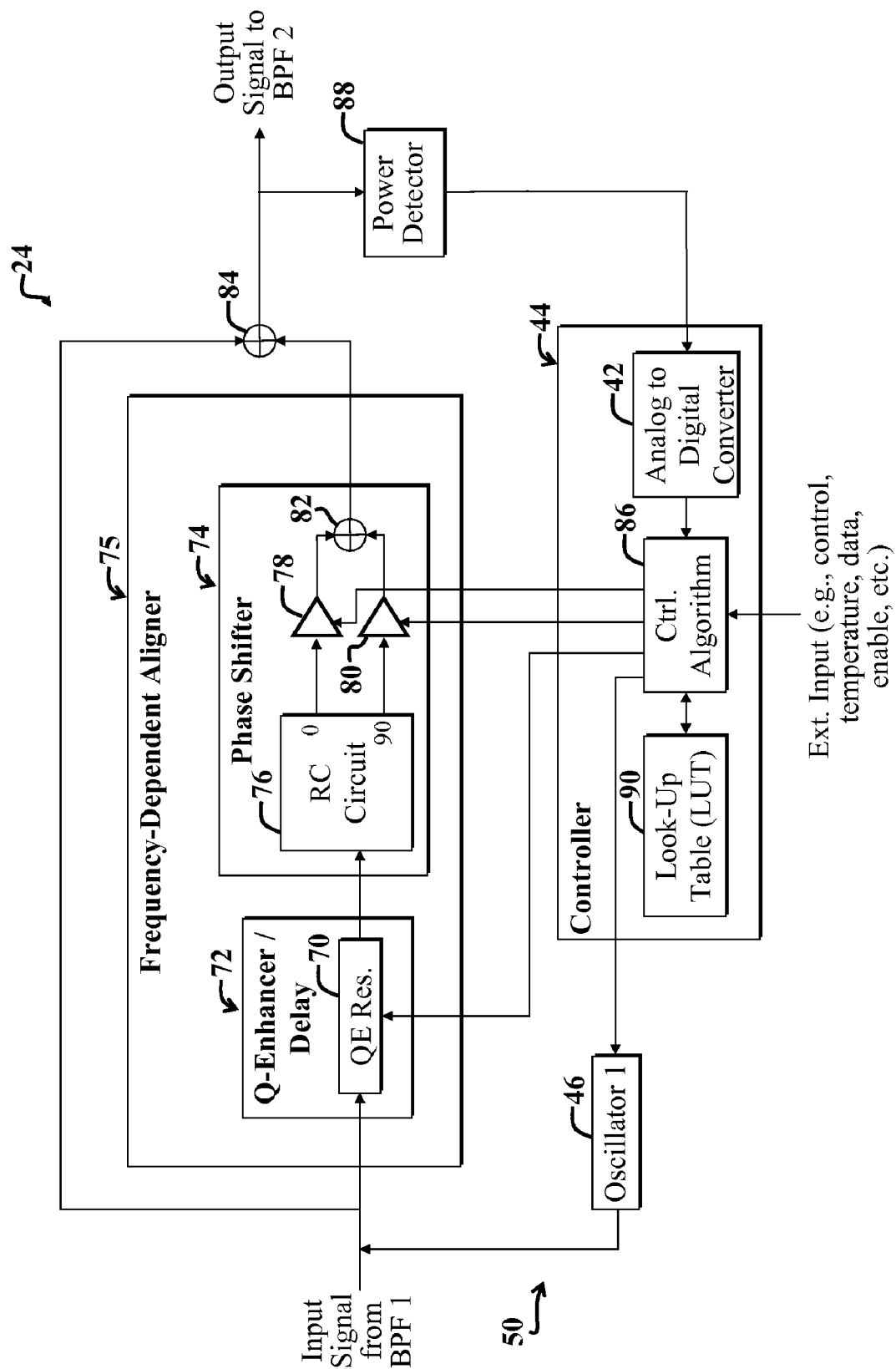
FIG. 5 is a more detailed diagram illustrating an example controller configuration suitable for use in configuring or calibrating a notch sub-filter of the controllable filter of FIG. 1.

FIG. 5 is a more detailed diagram illustrating an example controller configuration suitable for use in configuring or calibrating a notch sub-filter, such as the first notch sub-filter 24, of the controllable filter 10 of FIG. 1.

The first notch sub-filter 24 is shown including a QE resonator 70 as part of a Q-enhancer 72. The Q-enhancer 72 may implement a high-Q bandpass filter capable of providing a delay function for delaying predetermined input frequencies by a predetermined Tau. The QE resonator 70 provides input to a phase shifter 74 of the first notch sub-filter 24. The phase shifter 74 includes a Resistor-Capacitor (RC) circuit 76, a first output of which is coupled to a first VGA 78; a second output of which is coupled to a second VGA 80. Outputs of the first VGA 78 and the second VGA 80 are added via a first adder 82. An output of the first adder 82 is added to the input of the Q-enhancer 72 via a second adder 84. The VGAs 78, 80 receive control voltages, representing control signals, from a control algorithm 86 running on the controller 44. The controls affect mainly phase and gain of the signal output by the phase shifter 74.

The controller 44 may include temperature sensor 91 and power detector 88 which receives output from the first notch sub-filter 24 and provides a power indication to the control algorithm 86 in response thereto. The control algorithm 86 may also employ the signal from PADC 88/42 to access a LUT 90 as desired to facilitate calibrating the first notch sub-filter 24. In the present example embodiment, the control algorithm 86 also receives external inputs, such as voltage, indications of user-induced changes, and so on. The reference oscillator 46 receives control input from the control algorithm 86 and provides a pilot tone of a given frequency (test frequency) to the first notch sub-filter 24.

The notch sub-filter 24 acts as a canceller filter, which employs a modified version (modified by the Q-enhancer 72 and phase shifter 74) of the signal input to the second adder 84, to selectively cancel, suppress, or augment components of the input signal to yield a desired output signal. The Q-enhancer 72 and phase shifter 74 together implement a frequency-dependent aligner 75, which selectively aligns a modified version of the input signal so that when the modified signal is combined with the input signal, the resulting output signal exhibits one or more desired spectral characteristics.

The result is a desired frequency response of the notch sub-filter 24. The construction and operation of canceller filters, such as the notch sub-filter 24, are discussed in further detail in co-pending U.S. patent application Ser. No. 12/413,454, filed Mar. 27, 2009 and entitled "Filter Shaping Using a Signal-Cancellation Function," the entire contents of which are hereby incorporated herein by reference.

In operation, a pilot tone, i.e., a desired reference signal characterized by a desired reference frequency, is input to the notch sub-filter 24 via the reference oscillator 46 in response to a control signal from the control algorithm 86 to the reference oscillator 46. The desired reference frequency corresponds to the position of the notch in the frequency response of the notch sub-filter 24. For example, the desired reference frequency may correspond to the position of the notch 68 of FIG. 4.

The controller 44 then measures the power of the signal output from the notch sub-filter 24 via the power detector 88 (and ADC 42) and then makes an adjustment to the VGAs 78, 80 by applying a control voltage to the VGAs 78, 80. For the purposes of the present discussion, a control signal (e.g., voltage) of a VGA or oscillator may be any parameter, signal, or variable, or value that affects a frequency, amplitude, or other quality of a signal output from the VGA or oscillator.

The control algorithm 86 includes instructions for adjusting the VGAs 78, 80 so that the output power as measured by the power detector 88 is a minimum at the desired input pilot tone frequency provided by the reference oscillator 46.

The control algorithm 86 further includes instructions responsive to external inputs, such as temperature, voltage, user controls, indications of parameter changes, detection of interfering signals, and so on. The instructions include one or more routines for selectively shifting the center frequency of the notch of the frequency response of the notch sub-filter 24 in response to certain temperature changes or other inputs. For example, the LUT 90 may include various predetermined calibration settings for certain temperature or voltage ranges. When a certain temperature is detected, the control algorithm 86 employs the parameters stored in the LUT for the detected temperature change to shift the notch of the notch sub-filter 24 by a predetermined amount.

Figure 6:
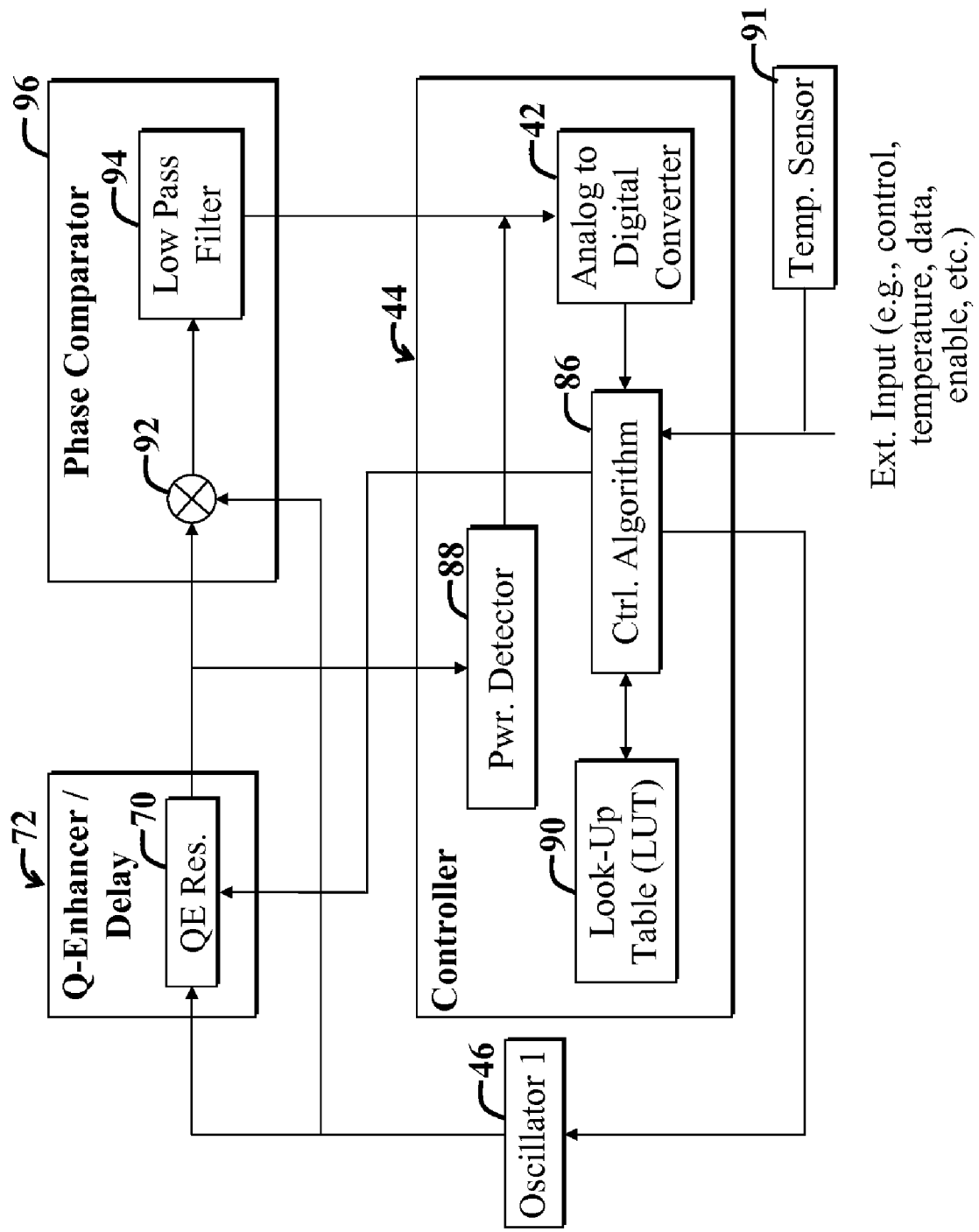
FIG. 6 is a more detailed diagram illustrating an example controller configuration suitable for use in configuring or calibrating a Quality factor Enhancer (QE) resonator used in the notch sub-filters of FIGS. 1-5.

FIG. 6 is a more detailed diagram illustrating an example controller configuration suitable for use in configuring or calibrating a QE resonator 70 used in the sub-filters 16, 24, 28, 34 of FIGS. 1-6.

In the present example embodiment, the oscillator (46) generates a pilot tone, which is settable via the look-up table (LUT) 90, which has been programmed either during fabrication (mask programming), automated testing of the IC (ATE) or product test/calibration. The oscillator frequency is at or around (+/− an offset frequency) the center frequency of the filter element being calibrated. The frequency offsets may be used to compensate for differences between stable and self-oscillating calibration mode. The frequency controlled oscillator 46 itself may be realized as LC, RC, crystal (pulled or in combination with a Phase Locked Loop (PLL)), Micro-ElectroMechanical (MEM), thermal coupled oscillator, and so on.

The pilot tone passes through the Q-Enhancer 72 where it is phase shifted and attenuated and then fed into a mixer 92. A second input of the mixer 92 is connected to an output of the oscillator 46 directly. The output of mixer 92 represents a signal that is indicative of the additional phase shift of the QE resonator 70. The output of the mixer 92 is connected to an input of a lowpass filter 94.

This lowpass filter 94 lets only the DC component of the input signal to pass. An output of the lowpass filter 94 is input to an ADC 42. The ADC 42 provides input to the control algorithm 86.

The control algorithm 86 may run on a processor that includes the controller 44 or may be implemented directly in logic, thus enabling trimming of the center frequency of the QE resonator 70 to exactly the desired frequency (which the oscillator 46 is tuned to) via capacitor switches built into the QE resonator 70. In this case, the QE resonator 72 is calibrated when the output voltage of lowpass filter 94 reaches its maximum. The parameter values for the QE resonator 70 may be stored in the LUT 90 or via another mechanism for use as needed. In the present example embodiment, for this calibration, the Q-Enhancer 72 is not operated in self-oscillation mode. In this case, gain calibration is carried out before other types of calibration.

In a second calibration mode, the output of the Q-Enhancer 72 may feed directly into a power detector 88, the output of which is input to the ADC 42. The output of ADC 42 is read by the control algorithm 86, which carries instructions to steer the frequency dependent elements inside the QE resonator 70 such that the output of the Q-Enhancer 72 reaches a maximum. In this case, the QE resonator 70 is trimmed to the frequency of the oscillator 46. Parameter values for the QE resonator 70 may be stored in the LUT 90 or via another mechanism for use as needed.

In a third calibration mode, the input of the Q-Enhancer 72 is disconnected from the output of the oscillator 46, and then the Q-Enhancer 72 is brought into self-oscillation mode. This may be achieved by steering the current or bias voltage as well as other methods like switching the gm (i.e., the transfer conductance, also called transconductance) values associated with the transistors in the Q-Enhancer, and may be detected with the power detector 88. Those skilled in the art may implement similar techniques without deviating from the scope of the present teachings.

In contrast to the aforementioned calibration modes, the mixer 92 may create an offset frequency which, in the subsequent lowpass filter 94, will be converted into an inverse proportional voltage. After conversion in the ADC 42 and processing by the control algorithm 86, the voltage at the output of the Q-Enhancer 72 is maximized via switching in or controlling the appropriate capacitors, inductors and so on, in the QE resonator 70. The parameter values for the QE resonator 70 may be stored in the LUT 90 or via another mechanism for use as needed. Various calibrated parameter values of the Q-enhancer 72, as stored in the LUT 90, may be adjusted to affect filter performance as desired.

For illustrative purposes, a temperature sensor 91 is shown providing temperature information to the control algorithm 86. The control algorithm 86, may include functionality, which may be implemented in hardware or software, for selectively changing filter calibration settings stored in the LUT in response to the detection of a temperature change exceeding a predetermined threshold. An example circuit for generating a temperature trigger in response to detection of a temperature change exceeding a predetermined threshold is discussed more fully below with respect to FIG. 7.

Note that during calibration, temperature values stored in the LUT 90 may be adjusted and may represent actual temperature measurements, or alternatively, only temperature offsets, i.e., incremental temperature changes are determined, and the offset values and associated filter calibration parameters in the LUT 90 are incrementally updated accordingly.

Furthermore, note that while the control algorithm 86 is depicted graphically by the single box 86, the control algorithm 86 may include various functionality and corresponding modules implemented in software and/or hardware. Furthermore, such control functionality need not be implemented in a single physical location on a chip or circuit board, but may be distributed as needed to meet the needs of a given implementation.

Those skilled in the art with access to the present teachings may readily implement software and/or hardware routines or circuits to implement the controller 44 without undue experimentation.

An alternative embodiment (shown in FIG. 7) may employ a self-triggered temperature calibration circuit. The two amplifiers may form a window comparator that turns active when the temporarily stored value from an accompanying temperature sensor deviates significantly from the actual value of the temperature sensor. The temporary storage of the temperature sensor value corresponds to a lowpass filtering and may be implemented in various different ways without departing from the scope of the present teachings.

In a similar way the temperature trigger may be implemented fully digital, thus providing a way to alter e.g. window size, trigger accuracy, hysteresis etc without departing from the scope of the present teachings.

Figure 7:
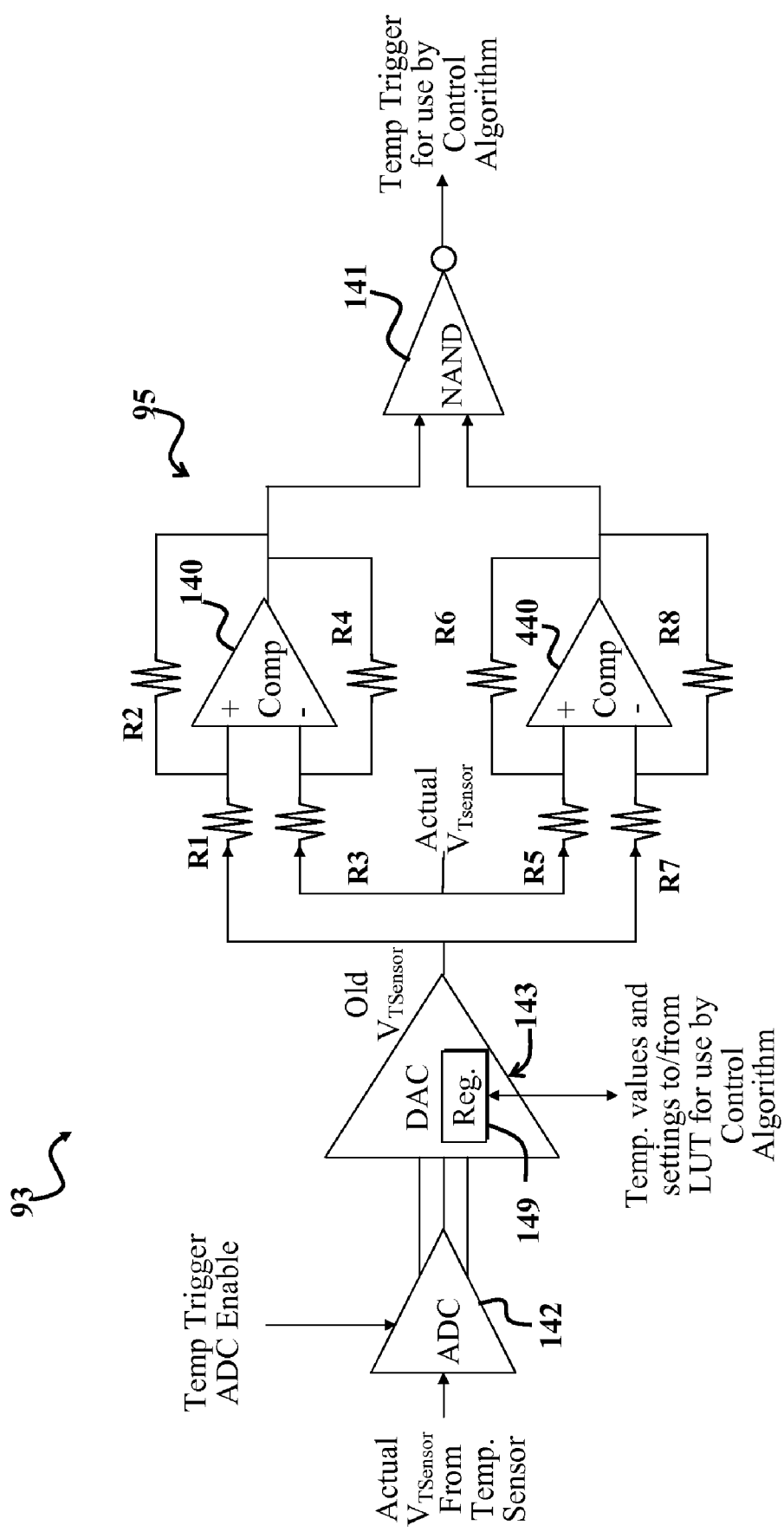
FIG. 7 is a diagram illustrating an example temperature-triggering circuit for facilitating implementing filter calibration when a sufficient change in temperature is detected.

FIG. 7 is a diagram of an example temperature-triggering circuit 93 for facilitating implementing filter calibration when a sufficient change in temperature is detected. The temperature-triggering circuit 93 includes an input ADC 142. The ADC 142 is selectively enabled via an ADC enable signal. The ADC enable signal may be generated by the control algorithm 86 or other mechanism, such as via a filter power-up signal from a power supply circuit. The ADC 142 receives an analog temperature measurement from a temperature sensor, such as the temperature sensor 91 of FIG. 6, and provides a representative digital signal to a DAC 143.

For illustrative purposes, the DAC 143 is shown including a register 149, which is adapted to store sequential digital temperature values for use by a calibration control algorithm, such as the control algorithm 86 of FIG. 6. Temperature values from the register 149 may be used by the control algorithm to ascertain near term temperature history; to reference calibration parameters in the LUT 90 of FIG. 6, and so on.

The DAC 143 converts the digital signal output by the ADC into digital values, which may be stored in the register 149. The output of the DAC 143 represents a temperature measurement that has been delayed by a predetermined time interval, and is therefore older than current temperature measurements by delay time interval. The output of the DAC 143 may correspond to an output of the register 149. The exact delay between the old temperature values and current sensor temperature values is application specific. The delay may be configured by adjusting the length of the register 149 and/or via other mechanisms.

A comparator section 95 of the temperature-triggering circuit 93 includes a first comparator 140, second comparator 440, and a NAND gate 141. A first resistor R1 is coupled between an output of the DAC 143 and a positive input of the first comparator 140. A second resistor R2 is coupled between an output of the first comparator and the positive input of the first comparator 140. A third resistor R3 is coupled between an actual temperature measurement from a temperature sensor and a negative terminal of the first comparator 140. A fourth resistor R4 is coupled between the output of the first comparator 140 and the negative input terminal thereof.

A fifth resistor R5 is coupled between the actual temperature measurement from a temperature sensor and a positive terminal of the second comparator 440. A sixth resistor R6 is coupled between an output of the second comparator 440 and a positive input terminal thereof. A seventh resistor R7 is coupled between the output of the DAC 143 and a negative terminal of the second comparator 440. An eighth resistor is coupled between an output of the second comparator 440 and a negative input terminal thereof. Outputs of the first comparator 140 and the second comparator 440 are input to separate input terminals of the NAND gate 141. The output of the NAND gate 141 represents a temperature-trigger signal suitable to trigger calibration in accordance with instructions included in a controller, such as included in the control algorithm 86 of FIG. 6. Calibration triggered by a predetermined change in temperature is considered a type of event-driven calibration. Note that other event-driven calibration triggers may be employed without departing from the scope of the present teachings.

In operation, the comparator section 95 compares an old temperature measurement, i.e., temperature sensor value (VTsensor Old), represented by the output of the DAC 143 with an actual temperature measurement (VTsensor) provided at a node between the third resistor R3 and the fourth resistor R4. The values of the resistors R1-R8 are chosen to implement a desired threshold temperature difference between old and current temperature measurements that must be surpassed for a temperature trigger signal to be output by the temperature-triggering circuit 93 via the output of the NAND gate 141. The resistors R1-R8 may be implemented as variable resistors to enable control over the temperature-difference threshold without departing from the scope of the present teachings.

If the outputs of the first comparator 140 and the second comparator 440 are both positive or high, then the output of the NAND gate 141, i.e., the output of the temperature-triggering circuit 93, will be low, and will not result in a temperature trigger.

If one or more of the outputs of first comparator 140 and the second comparator 440 are low, then the current temperature exceeds the old temperature measurement by the predetermined temperature threshold, and the output of the NAND gate 141 will be high, thereby representing a temperature trigger signal.

While the temperature-triggering circuit 93 is showing including an ADC 142 coupled to a separate DAC 143, note that other implementations are possible. For example, the ADC 142 and the DAC 143 may be replaced with a single device that includes an internal comparator that feeds an internal DAC. A counter may be coupled between the DAC and the internal comparator (not shown). The internal comparator is positioned to compare and determine when the voltage at the output of the internal DAC surpasses the input voltage thereto, at which point the counter contents are captured, and the resulting counter value represents the requisite ADC output. In this alternative implementation (not shown), the output of the internal DAC is fed back to an input of the internal comparator. The counter and the internal comparator facilitate implementing a counter ADC. The output of the counter represents a digital signal, which is input to the internal DAC.

Figure 8:
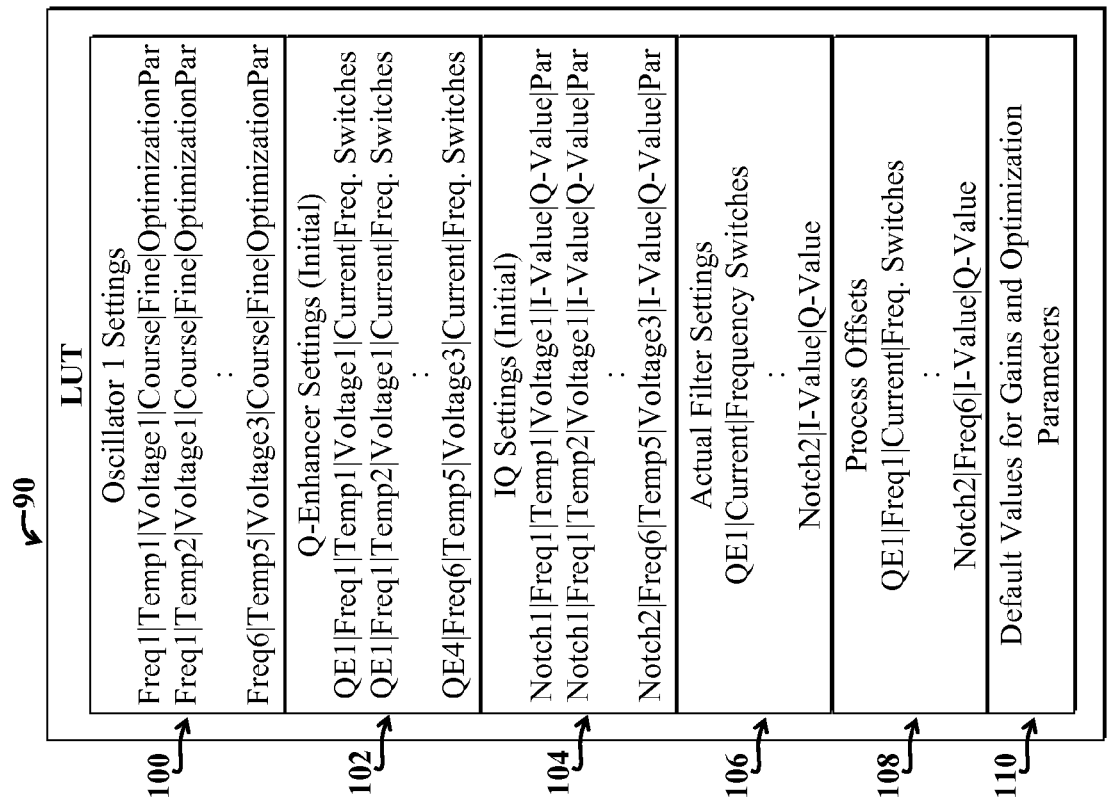
FIG. 8 is a diagram illustrating an example Look-Up Table (LUT) adapted for use with the embodiments of FIGS. 5, 6 and 7.

FIG. 8 is a diagram illustrating an example Look-Up Table (LUT) 90 adapted for use with the embodiments of FIGS. 1, 5, and 6. The LUT 90 includes oscillator settings 100, initial Q-enhancer settings 102, IQ settings 104, actual filter settings 106, process offsets 108, and default values for gains and optimization parameters 110.

Initial contents of the LUT 90 may be written during an initial ATE calibration phase, and the contents are thereafter updated and/or enhanced during subsequent periodic calibrations and/or event-driven calibrations. The initial contents, i.e., LUT settings may be derived from initial chip characterization measurements. The initial contents include various default values, such as frequency values, temperature offsets, voltage parameters, optimization parameters for maximum power settings, optimization parameters, e.g., gains, for maximum power settings, and so on. In the present embodiment, when a filter is calibrated, whether initially, during power up, or during operation, resulting calibration settings are thereafter stored in the LUT 90.

Note that during initial ATE, specific temperature values need not be stored in the LUT. Instead temperature offset values relative to an initial temperature may be stored instead. Similarly, offset values may be stored for LUT settings other than temperature. Note that actual values may be determined by offset values given corresponding base values.

For illustrative purposes, the oscillator settings 100 are stored in a three-dimensional array, which includes frequency, temperature, and voltage values and/or corresponding offsets. Measurements for six frequencies are shown, where each frequency has corresponding settings for five different temperatures and three different voltages (or offsets). In the present example, the corresponding filter includes three notched filters and three bandpass filters, which use six frequencies. Hence, different filters may include different arrangements of elements for each LUT field 100-110.

In the present example, the filter oscillator varies with temperature; so five temperature bins corresponding to each frequency are included by way of example. Note that certain elements may be omitted for certain implementations without departing from the scope of the present teachings. For example, in certain implementations, where the filter behavior does not vary significantly with respect to voltage, the voltage elements may be omitted.

The frequency, temperature, and voltage elements may be considered qualifiers or pointers to facilitate enabling the control algorithm to access calibration values quickly. The actual calibration values may be stored in the course field or fine field.

By way of example, for each notch filter component, the associated oscillator will have corresponding settings in the oscillator settings field 100. Similarly, each Q-enhancer will have corresponding settings stored in the Q-enhancer settings field 102, and each IQ modulator will have corresponding settings stored in the IQ settings field 104.

The actual filter settings field 106 may store actual filter settings after a given optimization. The process offsets field 108 may store offsets to certain calibration settings. The default parameters field 110 stores defaults for the various settings of the fields 100-106.

Different default parameters 110 may be set for compliance with different standards. For example, a first device standard may require specific filter settings to enable filter operation in stand-alone mode. Requisite parameters to facilitate such operation may be stored in the default parameters field 110.

Figure 9:
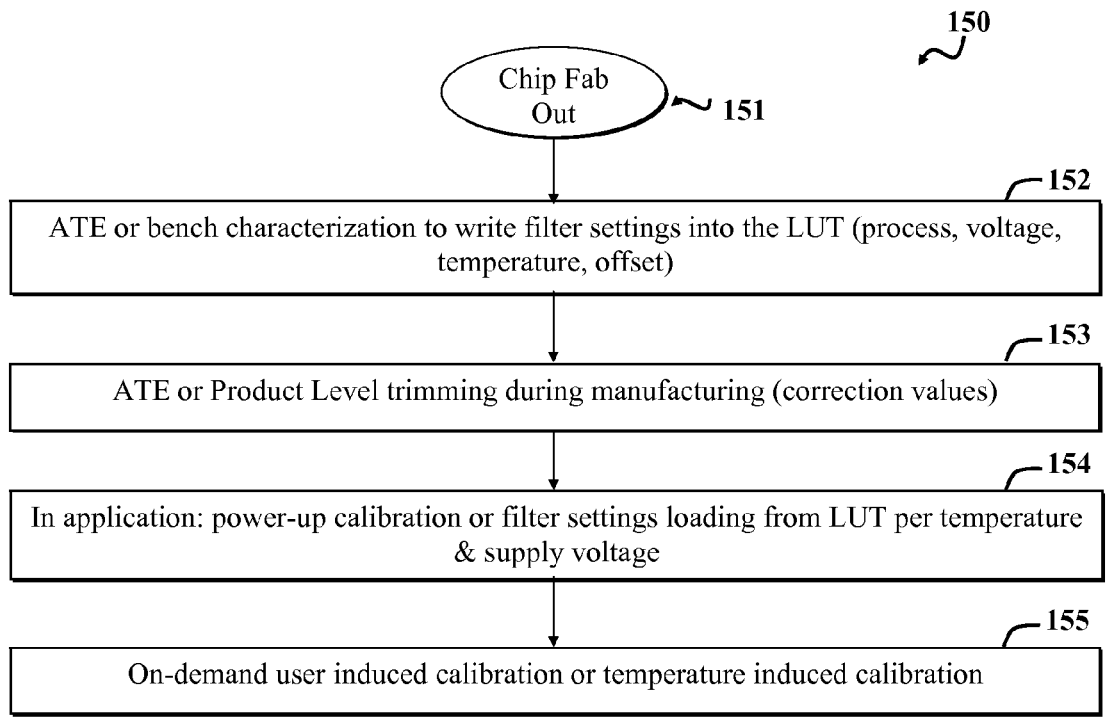
FIG. 9 is a flow diagram illustrating an example calibration sequence adapted for use with the embodiments of FIGS. 1, 5, and 6.

FIG. 9 is a flow diagram illustrating an example calibration sequence adapted for use with the embodiments of FIGS. 1, 5, and 6.

In accordance with the present teachings, a filter or other circuit, such as the filter 10 of FIG. 1 may be calibrated during chip testing via Automatic Test Equipment (ATE); during power-up of the filter; and while the filter is operating. While the filter is operating, the filter may be periodically calibrated at predetermined time intervals; may be calibrated in response to a trigger, such as a temperature trigger, and so on.

The example calibration sequence 150 of FIG. 9 is illustrative. After chip fabrication 151 during which the filter is fabricated on a chip, the calibration sequence 150 includes initial bench characterization of the filter, which may include writing predetermined temperature settings, process values, voltages, value offsets, and so on, to memory. The settings may be stored in memory via one or more data structures, such as the LUT of FIG. 8, which may be implemented via registers or other memory elements.

A second calibration step 153 includes using ATE or Product Level (PL) trimming to determine initial filter correction values.

A third calibration step 154 occurs during filter power-up, which includes loading predetermined filter settings from the LUT, as established in the initial bench characterization step 152.

A fourth calibration step 155 includes selectively calibrating the filter as desired, such as in response to a temperature change that surpasses a predetermined threshold.

Note that the example calibration process 150 may be modified without departing from the scope of the present teachings. For example, fewer or additional steps may be included and may be performed in different orders. For example, the filter settings in the LUT may be changed to cause the filter to operate in accordance with a desired standard.

Figure 10:
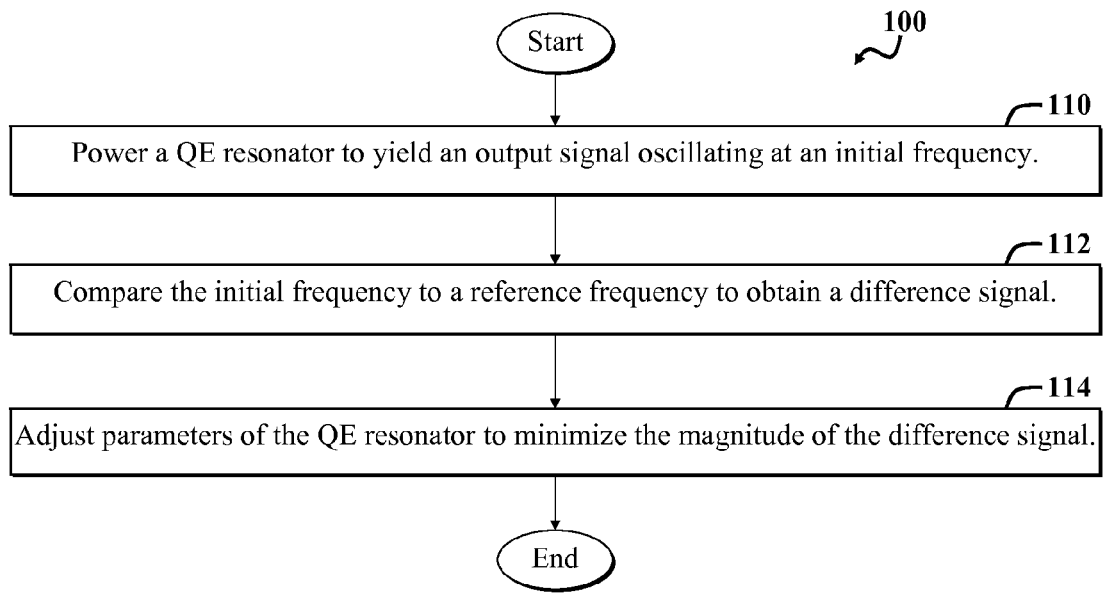
FIG. 10 is a flow diagram of a first example method suitable for calibrating or configuring the QE resonator of FIGS. 5-6.

FIG. 10 is a flow diagram of an example method 100 suitable for calibrating or configuring the QE resonator 70 of FIGS. 5-6. With reference to FIGS. 6 and 7, the method 100 includes a first step 110, which includes powering the QE resonator 70 so that its output oscillates at an initial frequency.

A second step 112 includes comparing the initial frequency to a reference frequency and providing a signal in response thereto.

A third step 114 includes setting one or more adjustable parameters of the QE resonator 70 to minimize the difference between the initial frequency and the reference frequency based on the signal.

Figure 11:
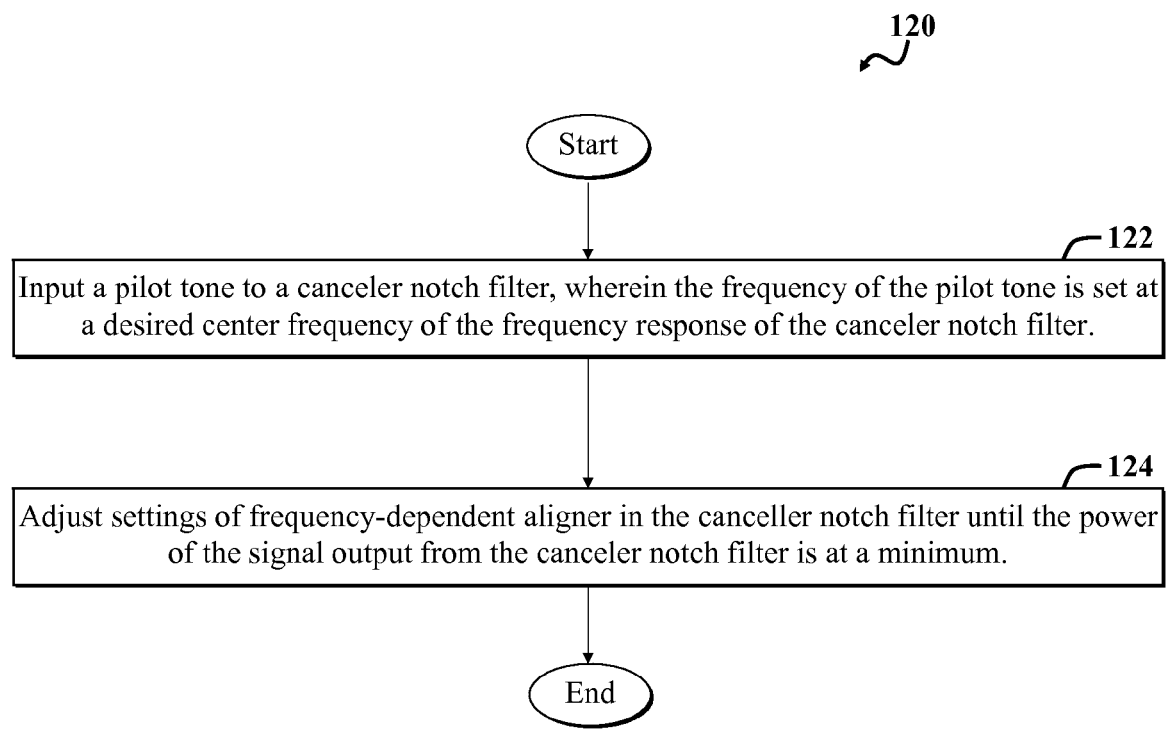
FIG. 11 is a flow diagram of a second example method suitable for calibrating or adjusting the center frequency of the notch sub-filter of FIG. 5.

FIG. 11 is a flow diagram of an example method 120 suitable for calibrating or adjusting the center frequency of a notch filter, such as the notch sub-filter 24 of FIG. 5. The example method 120 includes an initial step 122, which includes inputting a pilot tone to a notch sub-filter, wherein the pilot tone is set to the desired frequency of the notch of the frequency response of the notch filter. The location of a notch is referred to herein as the center frequency of the notch.

A subsequent step 124 includes adjusting the settings of one or more VGAs in a phase shifter of the notch filter until the output power of the notch filter is suppressed or is at a minimum. The resulting settings may be stored for future use.

Figure 12:
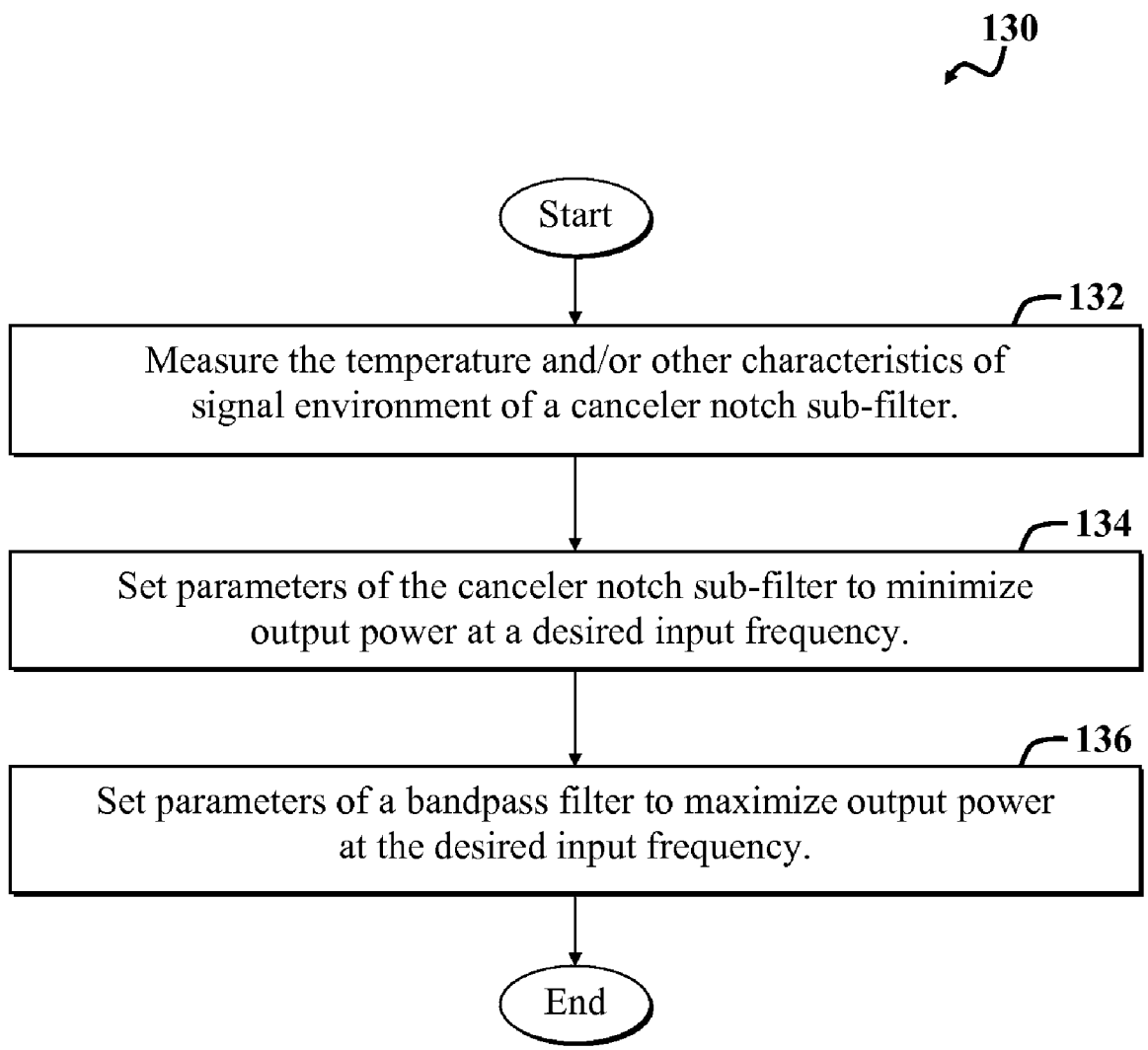
FIG. 12 is a flow diagram of a third example method for calibrating or configuring the controllable filter of FIG. 1.

FIG. 12 is a flow diagram of an example method 130 suitable for calibrating or configuring the controllable filter 10 of FIG. 1. The example method 130 includes an initial measuring step 132, which includes measuring temperature and/or other characteristics of the signal environment of the accompanying filter. These initial temperature values or other inputs may be used to initialize various parameters, such as capacitance values, VGA gain settings, and so on.

A subsequent notch-setting step 134 includes setting parameters of the notch sub-filters of the overall filter to minimize output power at one or more desired input frequencies.

A subsequent BPF-setting step 136 includes setting bandpass sub-filter parameters to maximize output power of the bandpass sub-filters at one or more desired input frequencies.

Although embodiments of the invention are discussed primarily with respect to adjustable analog filters and systems and methods for adjusting the controllable analog filters, embodiments of the invention are not limited thereto. For example, filters and accompanying control systems may be digital, analog, or hybrid systems, and such filters and control systems may find use in applications in a wide variety of fields.

Arrowheads shown on signal paths between various modules are for illustrative purposes only. For example, various communication paths or connecting lines, which appear to be unidirectional in the drawings, may be bidirectional without departing from the scope of the present invention.

Although a process of embodiments discussed herein may be presented as a single entity, such as software or hardware executing on a single machine, such software can readily be executed on multiple machines. That is, there may be multiple instances of a given software program, a single program may be executing on two or more processors in a distributed processing environment, parts of a single program may be executing on different physical machines, etc. Furthermore, two different programs, such as a convergence algorithm, a controller, and a noise-pattern analyzer can be executing in a single module, or in different modules.

Although the invention has been discussed with respect to specific example embodiments thereof, these embodiments are merely illustrative, and not restrictive, of the invention. In the description herein, numerous specific details are provided, such as examples of components and/or methods, to provide a thorough understanding of discussed example embodiments. One skilled in the relevant art will recognize, however, that certain embodiments can be practiced without one or more of the specific details, or with other apparatus, systems, assemblies, methods, components, materials, parts, and/or the like. In other instances, well-known structures, materials, or operations are not specifically shown or described in detail to avoid obscuring aspects of the example embodiments discussed herein.

A "machine-readable medium" or "computer-readable medium" may be any medium that can contain, store, communicate, propagate, or transport the program for use by or in connection with the instruction execution system, apparatus, system or device. The computer readable medium can be, by way of example only but not by limitation, an electronic, magnetic, optical, electromagnetic, infrared, or semiconductor system, apparatus, system, device, propagation medium, or computer memory.

A "processor" or "process" includes any human, hardware and/or software system, mechanism or component that processes data, signals or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real time," "offline," in a "batch mode," etc. Portions of processing can be performed at different times and at different locations, by different (or the same) processing systems. A computer may be any processor in communication with a memory.

Reference throughout this specification to "one embodiment", "an example embodiment", or "a specific embodiment" means that a particular feature, structure, or characteristic described in connection with the embodiment not necessarily included in all possible example embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment or example embodiment discussed herein may be combined in any suitable manner with one or more other embodiments. It is to be understood that other variations and modifications of the embodiments described and illustrated herein are possible in light of the teachings herein, and the variations are to be considered as part of the spirit and scope of the present invention.

Example embodiments discussed herein may be implemented in whole or in part by using a programmed general purpose digital computer; by using application specific integrated circuits, programmable logic devices, optical, chemical, biological, quantum or nanoengineered systems or mechanisms; and so on. In general, the functions of various embodiments can be achieved by any means as is known in the art. Distributed or networked systems, components, and/or circuits can be used. Communication, or transfer of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope of the present invention to implement a program or code that can be stored in a machine-readable medium to permit a computer to perform any of the methods described above.

As used in the description herein and throughout the claims that follow "a", "an", and "the" include plural references unless the context clearly dictates otherwise. Furthermore, as used in the description herein and throughout the claims that follow, the meaning of "in" includes "in" and "on" unless the context clearly dictates otherwise.

The foregoing description of illustrated example embodiments, including what is described in the Abstract, is not intended to be exhaustive or to limit the invention to the precise forms disclosed herein. While certain example embodiments are described herein for illustrative purposes only, various equivalent modifications are possible within the spirit and scope of the present invention, as those skilled in the relevant art will recognize and appreciate. As indicated, these modifications may be made in light of the foregoing description of illustrated example embodiments and are to be included within the spirit and scope of the present invention.

Thus, while example embodiments have been described herein, a latitude of modification, various changes and substitutions are intended in the foregoing disclosures, and it will be appreciated that in some instances some features of embodiments will be employed without a corresponding use of other features without departing from the scope and spirit of the invention. Therefore, many modifications may be made to adapt a particular situation or material to the essential scope and spirit of the present invention. It is intended that the invention not be limited to the particular terms used in following claims and/or to a particular embodiment disclosed as the best mode contemplated for carrying out this invention, but that the invention will include any and all embodiments and equivalents falling within the scope of the appended claims.

What is claimed is:

1. A filter controller comprising:
   a reference signal generator that generates a known reference signal based on a control signal and provides the known reference signal to an adjustable filter;
   a detector that measures a response of the adjustable filter to the known reference signal and provides a detector signal in response thereto; and
   a control processor that sets one or more parameters of the adjustable filter in response to the detector signal.

2. The filter controller of claim 1, wherein the control processor provides the control signal and the one or more parameters include values associated with one or more circuit elements.

3. The filter controller of claim 2, wherein the one or more circuit elements include one or more variable capacitors and the values associated with the one or more circuit elements comprise capacitance values of the one or more variable capacitors.

4. The filter controller of claim 1, wherein the one or more parameters include one or more gain settings for one or more VGAs included in the adjustable filter.

5. The filter controller of claim 1, wherein the adjustable filter includes a plurality of sub-filter elements and switches between ones of the plurality of sub-filter elements.

6. The filter controller of claim 5, wherein the plurality of sub-filter elements include a canceller filter, a bandpass filter, and a notch filter.

7. The filter controller of claim 6, wherein the canceller filter includes a Quality factor Enhancer (QE) resonator or a group delay adjusting device.

8. The filter controller of claim 7, wherein the control processor further adjusts one or more values of one or more circuit elements of the QE resonator or the group delay adjusting device.

9. The filter controller of claim 8, wherein the control processor further
   sets an input signal to the QE resonator so that an output of the QE resonator exhibits an oscillation frequency,
   compares the oscillation frequency to a reference frequency,
   generates a difference signal in response thereto, and
   adjusts the one or more circuit values of the one or more circuit elements of the QE resonator to reduce or minimize the difference signal.

10. The filter controller of claim 6, wherein the canceller filter includes a phase shifter.

11. The filter controller of claim 10, wherein the control processor further adjusts a notch frequency of a frequency response of the canceller filter by inputting a pilot signal at a first frequency to the phase shifter and adjusts one or more Quality factor Enhancer (QE) resonators or group delay adjusting devices of the canceller filter so that a power level of an output signal of the canceller filter is reduced or minimized at the first frequency.

12. The filter controller of claim 11, wherein the first frequency corresponds to a desired notch frequency of the canceller filter.

13. The filter controller of claim 6, wherein the canceller filter is characterized by a notched frequency response.

14. The filter controller of claim 1, wherein the control processor further determines the one or more parameters of the adjustable filter based on a circuit environment of the controllable filter.

15. The filter controller of claim 14, wherein the control processor further establishes one or more values of the one or more parameters based on a temperature measurement of the signal environment.

16. The filter controller of claim 14, wherein the control processor further adjusts one or more of the parameters at predetermined time intervals.

17. The filter controller of claim 14, wherein the control processor further adjusts one or more of the parameters in response to a channel change detected in a circuit environment in which the adjustable filter is positioned.

18. The filter controller of claim 14, wherein the control processor further sets one or more parameters of one or more notch sub-filters of the adjustable filter to suppress output power of the notch sub-filters at one or more desired frequencies.

19. The filter controller of claim 14, wherein the control processor further sets one or more parameters of one or more bandpass sub-filters of the adjustable filter to increase or maximize output power of the one or more bandpass sub-filters at one or more desired frequencies.

20. The filter controller of claim 1, wherein the control processor further selectively calibrates each bandpass sub-filter of the adjustable filter as a notch filter.

21. The filter controller of claim 1, wherein the control processor further selectively calibrates each notch filter of the adjustable filter as a bandpass filter.

22. A method for implementing dynamic filter calibration, the method comprising:
providing, by a reference signal generator, a known reference signal to an adjustable filter based on a control signal;
sensing, by a detector, at least one condition of the adjustable filter and providing a first signal in response thereto;
determining, by a control processor, one or more values for one or more circuit parameters of the adjustable filter in response to the detector signal; and
setting, by the control processor, the one or more circuit parameters of the adjustable filter based on the one or more values to thereby selectively adjust a frequency response of the adjustable filter.

23. The method of claim 22, wherein sensing includes measuring, by the detector, a temperature of an environment in which the adjustable filter is positioned and providing, as the first signal, a temperature signal in response thereto.

24. The method of claim 23, wherein determining further includes referencing, by the control processor, a look-up table using the temperature signal to facilitate determining the one or more values.

25. The method of claim 22, wherein sensing includes determining, by the sensor, a channel setting of a system that is in proximity to the adjustable filter.

26. The method of claim 22, wherein setting includes applying, by the control processor, control signals to one or more VGAs included in the adjustable filter to shift a frequency response of the adjustable filter.

27. The method of claim 26, wherein setting further includes adjusting, by the control processor, a frequency response of a notch sub-filter included in the adjustable filter.

28. The method of claim 22, wherein setting includes applying, by the control processor, one or more control signals to one or more controllable capacitors included in the adjustable filter.

29. The method of claim 28, wherein setting further includes adjusting, by the control processor, a resonating frequency of a Quality factor Enhancer (QE) resonator of the adjustable filter.

30. The method of claim 22, further comprising
storing, by the control processor, the one or more values for one or more circuit parameters in a look-up table.

31. The method of claim 30, further comprising selecting, by the control processor, the one or more values for the one or more circuit parameters among values stored in the look-up table for the one or more circuit parameters.

32. A method for calibrating a circuit module, the method comprising:
providing a known reference signal to the circuit module so that the circuit module resonates, yielding an oscillating output signal in response thereto;
comparing a resonating frequency characterizing the output signal to a reference signal characterizing the known reference signal; and
adjusting one or more parameters of the circuit module in response to the comparing.

33. A method for calibrating a circuit module, the method comprising:
providing a known reference pilot signal to the circuit module, the known reference pilot signal being characterized by a frequency corresponding to a desired notch frequency of a frequency response of the circuit module; and
adjusting one or more characteristics of one or more circuit components of the circuit module until an output power of the circuit module exhibits a desired characteristic.

34. The method of claim 33, wherein the desired characteristic includes the output power of the circuit module reaching an approximate minimum.

35. The method of claim 33, wherein the desired characteristic includes the output power of the circuit module reaching an approximate maximum.

* * * * *